United States Patent
Chung

(10) Patent No.: US 7,606,099 B2
(45) Date of Patent: Oct. 20, 2009

(54) SEMICONDUCTOR MEMORY DEVICE CONTROLLING OUTPUT VOLTAGE LEVEL OF HIGH VOLTAGE GENERATOR ACCORDING TO TEMPERATURE VARIATION

(75) Inventor: Hwi-Taek Chung, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 304 days.

(21) Appl. No.: 11/621,251

(22) Filed: Jan. 9, 2007

(65) Prior Publication Data

US 2008/0018377 A1    Jan. 24, 2008

(30) Foreign Application Priority Data

Feb. 7, 2006    (KR) .................... 10-2006-0011851

(51) Int. Cl.
*G11C 7/00*    (2006.01)
(52) U.S. Cl. ............. 365/211; 365/189.09; 365/189.11; 365/210.12; 365/241
(58) Field of Classification Search ................. 365/211, 365/189.11, 189.09, 241, 210.12
See application file for complete search history.

(56) References Cited

U.S. PATENT DOCUMENTS

| | | | | | |
|---|---|---|---|---|---|
| 5,163,021 | A | * | 11/1992 | Mehrotra et al. | ....... 365/185.03 |
| 5,541,878 | A | * | 7/1996 | LeMoncheck et al. | . 365/185.03 |
| 5,687,116 | A | * | 11/1997 | Kowshik et al. | ........ 365/185.03 |

FOREIGN PATENT DOCUMENTS

| | | |
|---|---|---|
| KR | 1998-032459 | 7/1998 |
| KR | 1020020041876 | 6/2002 |
| KR | 1020030057885 | 7/2003 |

* cited by examiner

*Primary Examiner*—Pho M. Luu
(74) *Attorney, Agent, or Firm*—F. Chau & Assoc., LLC

(57) ABSTRACT

A semiconductor memory device controlling an output voltage level of a high voltage generator in response to a variation of temperature has a high voltage generator that provides a high voltage higher than a power source voltage through an output terminal, generates a temperature detection signal obtained by sensing a variation of a diode current based on a temperature variation, and adjusts a voltage level of the output terminal in response to the temperature detection signal. The device is able to automatically control an output voltage or current of the high voltage generator.

17 Claims, 6 Drawing Sheets

SEMICONDUCTOR MEMORY DEVICE CONTROLLING OUTPUT VOLTAGE LEVEL OF HIGH VOLTAGE GENERATOR ACCORDING TO TEMPERATURE VARIATION

CROSS-REFERENCE TO RELATED APPLICATION

This U.S. non-provisional patent application claims priority under 35 U.S.C. § 119 of Korean Patent Application No. 2006-11851 filed on Feb. 7, 2006, the entire contents of which are hereby incorporated by reference.

BACKGROUND

The present disclosure relates to semiconductor memory devices and, more particularly, to a semiconductor memory device controlling an output voltage level of a high voltage generator in accordance with variations in temperature.

Semiconductor memory devices are storage units capable of containing data, and from which the data are read out as needed. Semiconductor memory devices may be briefly classified into random access memories (RAMs) and read-only memories (ROMs). RAMs are kinds of volatile memory devices that lose their data in the absence of a power supply. ROMs are nonvolatile memories that retain their data even without power supply. RAMs include dynamic RAM, static RAM, and so on. ROMs include programmable ROM (PROM), erasable and programmable ROM (EPROM), electrically EPROM (EEPROM), flash memory, and so on. Flash memories are divided into NAND and NOR types.

Further, a semiconductor memory device usually employs an internal high voltage generator for producing a high voltage, for example, 9V, from a lower power source voltage, for example, 1.2V. Such a high voltage provided from the high voltage generator is usually used to carry out a programming or erasing operation. For instance, a NAND flash memory requires a voltage of about 18V for programming and a voltage of about 20V for erasing. Furthermore, a NOR flash memory needs a voltage of about 5V (in a stack-gate memory cell) or about 9V (in a split-gate memory cell), for programming.

In a general flash memory device, it is required to apply a correct high voltage level to the memory cells during a programming or erasing operation. Variations of processing conditions in fabricating semiconductor chips, however, cause high voltage levels to be irregular according to their positions in manufacturing lots or even in the same wafer. For the purpose of solving such a problem, such high voltages are trimmed to desired levels, respective to the chips, during chip test operations. Nevertheless, an output level of the high voltage generator will fluctuate in accordance with temperature variations, as well as variations of processing conditions. If a high voltage output becomes irregular caused by variations of temperature, it results in deterioration of program and erasure characteristics.

SUMMARY OF THE INVENTION

Exemplary embodiments of the present invention are directed to solve the aforementioned problems, by providing a semiconductor memory device automatically controlling an output voltage level of its high voltage generator.

An exemplary embodiment of the present invention provides a semiconductor memory device comprising: a memory cell array; a high voltage generator providing a high voltage greater than a power source voltage to the memory cell array through an output terminal, generating a temperature detection signal by detecting variations of a diode current in accordance with variations in temperature, and adjusting a voltage level of the output terminal in response to the temperature detection signal.

In an exemplary embodiment, the high voltage generator comprises: a pump circuit generating the high voltage by boosting the power source voltage; a regulator adjusting an output voltage of the pump circuit in response to the temperature detection signal; and a temperature detector generating the temperature detection signal by detecting variations of a diode current in accordance with variations of temperature.

In an exemplary embodiment, the high voltage generator comprises: a pump circuit including a normal pump and a temperature pump; a regulator adjusting an output voltage of the pump circuit; and a temperature detector generating the temperature detection signal by sensing variation of the diode current according to variation of temperature. The temperature pump adjusts an output current of the pump circuit in response to the temperature detection signal.

In an exemplary embodiment, the high voltage is a voltage to be provided to the memory cell array for programming or erasing data.

An exemplary embodiment of the present invention provides a semiconductor memory device comprising: a memory cell array; a pump circuit providing the memory cell array with a high voltage by boosting a power source voltage in response to a pumping enable signal; a regulator generating the pumping enable signal in accordance with an output voltage level of the pump circuit and adjusting the output voltage level of the pump circuit in response to a temperature detection signal; and a temperature detector generating the temperature detection circuit by sensing variations of a diode current according to variations of temperature.

In an exemplary embodiment, the regulator comprises a trimming circuit adjusting the output voltage level of the pump circuit in response to the temperature detection signal. The trimming circuit is a transistor that is turned on or off in response to the temperature detection signal. The trimming circuit comprises low and high-temperature trimming circuits. The high-temperature trimming circuit raises the output voltage level of the pump circuit in response to a high-temperature detection signal and the low-temperature trimming circuit lowers the output voltage level of the pump circuit in response to a low-temperature detection signal.

According to an exemplary embodiment, a temperature detector comprises: a temperature sensor that operates to sense variations of a diode current in accordance with variations of temperature and generating a temperature sensing voltage through a temperature sensing node; and a temperature detection signal generator comparing the temperature sensing voltage with a reference voltage and generating the temperature detection signal. The temperature sensor generates a high-temperature sensing voltage through a high-temperature sensing node and generates a low-temperature sensing voltage through a low-temperature sensing node, in which the temperature detection signal generator operates to generate a high-temperature detection signal by comparing the high-temperature sensing voltage with the reference voltage and to generate a low-temperature detection signal by comparing the low-temperature sensing voltage with the reference voltage.

In an exemplary embodiment of the present invention, a semiconductor memory device comprises: a memory cell array; a pump circuit generating a high voltage by boosting a power source voltage in response to a pumping enable signal, providing the high voltage to the memory cell array through an output terminal, and adjusting a voltage level of the output terminal in response to a temperature detection signal; a regulator connected to the output terminal of the pump circuit, generating the pumping enable signal in accordance with the voltage level of the output terminal; and a temperature detection circuit generating the temperature detection signal by sensing variations of a diode current according to variations of temperature.

In an exemplary embodiment, the pump circuit comprises normal and temperature pumps receiving the pumping enable signal, in which the temperature adjusts an output current of the pump circuit in response to the pumping enable signal and a temperature detection signal. The temperature detection circuit comprises: a temperature sensor that operates to sense variations of the diode current in accordance with variations of temperature and generating a temperature sensing voltage through a temperature sensing node; and a temperature detection signal generator comparing the temperature sensing voltage with a reference voltage and generating the temperature detection signal. The pump circuit raises a level of the output current in response to the temperature detection signal.

A further understanding of the nature and advantages of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the attached figures. In the figures.

DETAILED DESCRIPTION OF EXEMPLARY EMBODIMENTS

Figure 1:
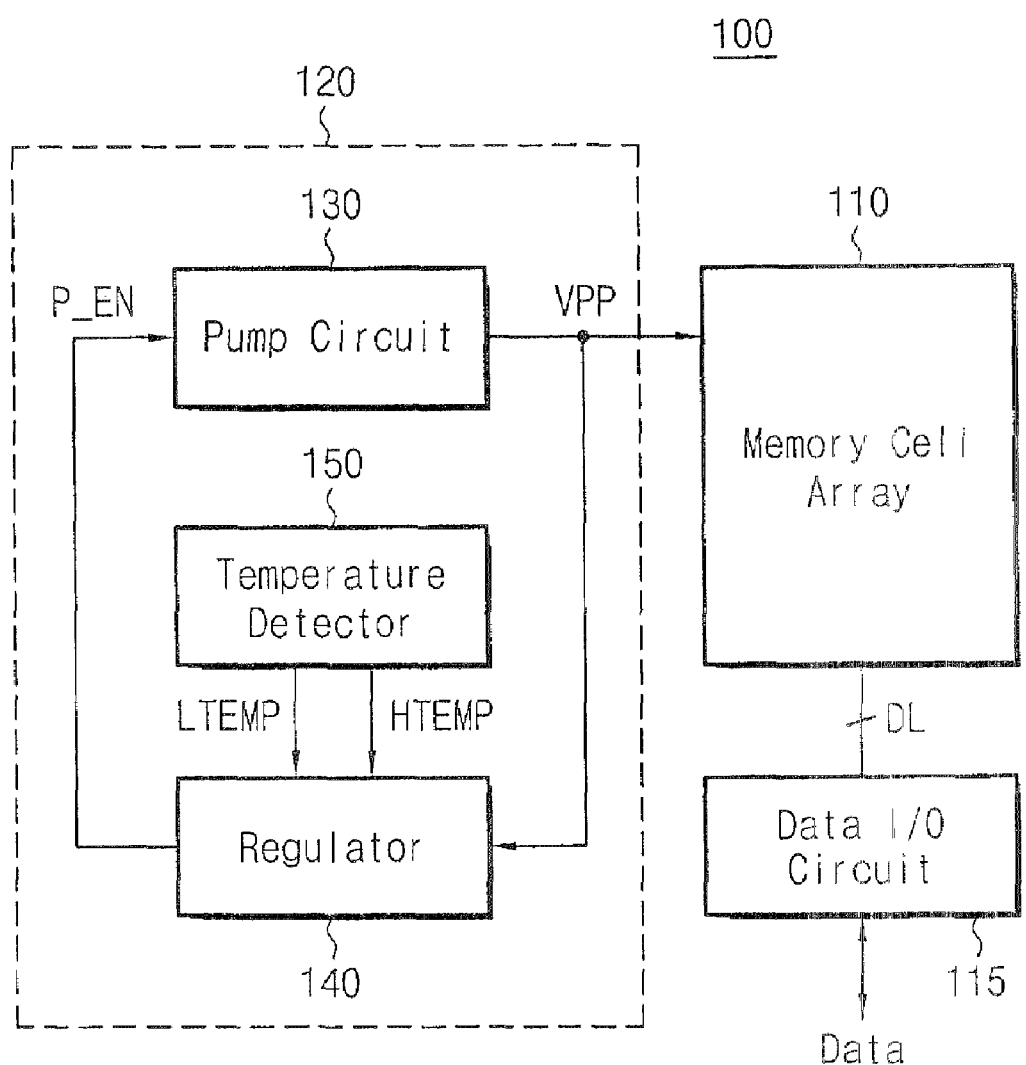
FIG. 1 is a block diagram illustrating a semiconductor memory device in accordance with an exemplary embodiment of the present invention.

Hereinafter, exemplary embodiments of the present invention will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. Like reference numerals refer to like elements throughout the accompanying figures.

FIG. 1 is a block diagram illustrating a semiconductor memory device in accordance with an exemplary embodiment of the present invention. Referring to FIG. 1, the semiconductor memory device 100 is comprised of a memory cell array 110, a data input/output circuit 115, and a high voltage generator 120. The semiconductor memory device 100 has a function of automatically adjusting an output voltage VPP of the high voltage generator 120.

The memory cell array 110 is composed of plural memory cells (not shown). For example, the memory cell array 110 may be formed of NAND flash memory cells connected in a string pattern, stack-gate NOR flash memory cells, or split-gate NOR flash memory cells. The memory cells are connected to the data input/output circuit 115 through data lines DL.

During a programming operation, a NAND flash memory cell is supplied with a program voltage of about 18V through its corresponding word line. A stack-gate NOR flash memory cell is supplied with program voltages of about 10V through its corresponding word line and about 5V through its corresponding bit line. On the other hand, a split-gate NOR flash memory cell is supplied with a program voltage of about 9V through a source line. Such a high voltage VPP for programming is provided from the high voltage generator 120.

The data input/output circuit 115 is connected to the memory cell array 110 by way of the data lines DL. The data input/output circuit 115 receives externally supplied program data of outputs read data to external devices (not shown). The data input/output circuit 115 may include a write driver, a sense amplifier, an input buffer, and an output buffer (all not shown).

Referring to FIG. 1, the high voltage generator 120 is comprised of a pump circuit 130, a regulator 140, and a temperature detector 150. The high voltage generator 120 adjusts the output voltage VPP, which is generated from the pump circuit 130, by controlling a trimming loop of the regulator 140 in accordance with temperature detection signals HTEMP and LTEMP from the temperature detector.

The pump circuit 130 provides the high voltage VPP, which is higher than a power source voltage VCC, to the memory cell array 110. With the high voltage VPP provided from the pump circuit 130, the memory cell array 110 can conduct a programming or erasing operation. The pump circuit 130 operates in response to a pumping enable signal P_EN from the regulator 140, boosting the power source voltage VCC to the higher voltage VPP.

The regulator 140 controls the pump circuit 130 to generate a constant level of the output voltage VPP. The regulator 140 detects whether the output voltage VPP of the pump circuit 130 reaches a predetermined level. The regulator 140 provides the pumping enable signal P_EN to the pump circuit 130 in accordance with a result of the voltage level detection. For instance, the regulator 140 generates the pumping enable signal P_EN when the output voltage VPP is lower than the predetermined level, for example, 9V.

The regulator 140 receives the temperature detection signals HTEMP and LTEMP from the temperature detector 150. Here, HTEMP denotes a high-temperature detection signal, while LTEMP denotes a low-temperature selection signal. The regulator 140 adjusts the output voltage VPP of the pump circuit 130, responding to the temperature detection signals HTEMP and LTEMP, in accordance with variations of temperature. Structural and operational features of the regulator 140 will be detailed with reference to FIG. 2.

Figure 2:
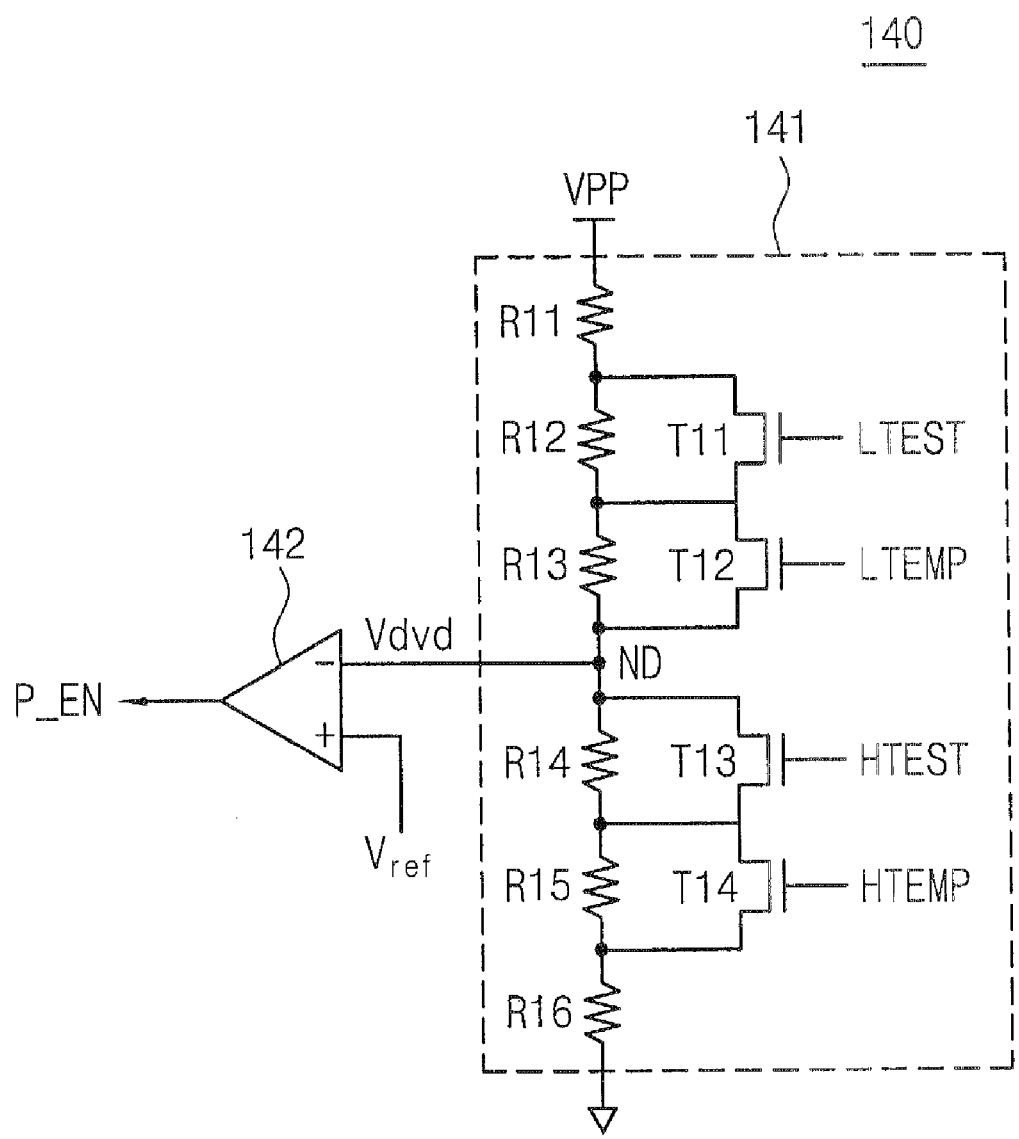
FIG. 2 is a circuit diagram exemplarily illustrating the regulator shown in FIG. 1.

FIG. 2 is a circuit diagram exemplarily illustrating the regulator 140 shown in FIG. 1. Referring to FIG. 2, the regulator 140 is comprised of a voltage divider 141 and a comparator 142.

The voltage divider 141 is connected between the output terminal of the pump circuit 130 and a ground terminal. The voltage divider 141 generates a division voltage Vdvd through a division node ND. The voltage divider 141 includes a plurality of resistors R11~R16 and a plurality of trimming circuits T11~T14. The first through sixth resistors R11~R16 are serially connected between the input terminal and the ground terminal. The first through fourth trimming circuits T11~T14 are respectively coupled across the second through fifth resistors R12~R15 in parallel.

The first and third trimming circuits T11 and T13 are provided for a test trimming operation, measuring the output voltage VPP of the pump circuit 130, during a chip test mode, and trimming the output voltage VPP to a desired level. The first trimming circuit T11 is provided to lower a level of the output voltage VPP. The third trimming circuit T13 is provided to raise a level of the output voltage VPP. The first and third trimming circuits T11 and T13 adjust a level of the output voltage VPP in response to test signals LTEST and HTEST respectively fed thereto. In FIG. 2, while the first and third trimming circuits T11 and T13 are formed of NMOS transistors, they may also be implemented in PMOS transistors, pass transistors, fuses, or other elements.

The second and fourth trimming circuits T12 and T14 are provided for a temperature trimming operation, automatically trimming the output voltage VPP to a desired level in accordance with variations of temperature during a chip operation. The second trimming circuit T12 is provided to lower a level of the output voltage VPP. The fourth trimming circuit T14 is provided to raise a level of the output voltage VPP. The second trimming circuit lowers a level of the output voltage VPP in response to the low-temperature detection signal LTEMP. The fourth trimming circuit T14 raises a level of the output voltage VPP in response to the high-temperature detection signal HTEMP. In FIG. 2, while the second and fourth trimming circuits T12 and T14 are formed of NMOS transistors, they may also be implemented in PMOS transistors, pass transistors, fuses, or other elements.

The comparator 142 compares the division voltage Vdvd with a reference voltage Vref. The reference voltage Vref is supplied from a reference voltage generator (not shown). The comparator 142 provides the pumping enable signal P_EN of a high level to the high voltage generator 120 shown in FIG. 1 when the division voltage Vdvd becomes lower than the reference voltage Vref.

Referring to FIG. 2, the regulator 140 lowers the division voltage Vdvd in response to the high-temperature detection signal HTEMP. When the pumping enable signal Vdvd is lowered, the pumping enable signal P_EN is generated. If the pumping enable signal P_EN is activated, the output voltage VPP of the high voltage generator 120 rises. According to the semiconductor memory device 100 shown in FIG. 1, the output voltage VPP of the high voltage generator 120 becomes higher as the temperature increases. An elevation range of the output voltage VPP is variable in accordance with the resistance of the fifth resistor R15 of the voltage divider 141. Thereby, the semiconductor memory device 100 shown in FIG. 1 is improved in curing the period of time that is takes for the output voltage VPP of the high voltage generator 120 to drop in high temperature. Similarly, the semiconductor memory device 100 shown in FIG. 1 is improved in curing the time that it takes for the output voltage VPP of the high voltage generator 120 to rise in the presence of a low temperature.

As illustrated in FIG. 1, the high voltage generator 120 includes the temperature detector 150. The temperature detection circuit 150 operates by utilizing the temperature dependency of a diode. The temperature detector 150 provides the high-temperature detection signal HTEMP or the low-temperature detection signal LTEMP to the voltage divider 141 of the regulator 140. Structural and operational features of the temperature detector 150 will be described in conjunction with FIG. 3.

Figure 3:
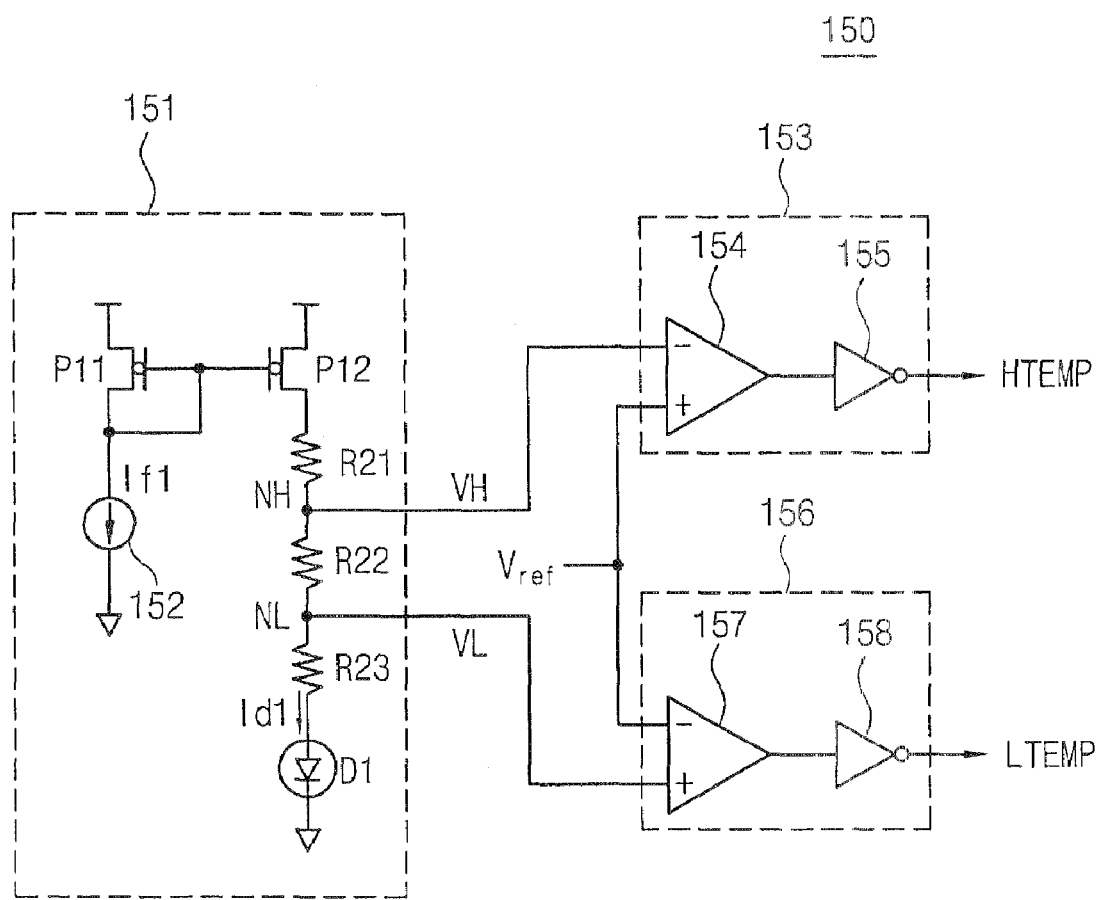
FIG. 3 is a circuit diagram exemplarily illustrating the temperature detector shown in FIG. 1.

FIG. 3 is a circuit diagram exemplarily illustrating the temperature detector 150 shown in FIG. 1. Referring to FIG. 3, the temperature detector 150 is comprised of a temperature sensing circuit 151, a high-temperature detection signal generator 153 and a low-temperature detection signal generator 156.

The temperature sensing circuit 151 is formed with a current mirror circuit composed of a current source 152 and PMOS transistors P11 and P12, resistors R21, R22, and R23, and a diode D1. The current mirror circuit operates to cause a current to flow through the PMOS transistor P12 from the current source 152. The resistors, R21, R22, and R23, are connected between the current mirror circuit and the diode D1 in series. The first resistor R21 is connected between the current mirror circuit and a high-temperature sensing node NH. The second resistor R22 is connected between the high-temperature sensing node NH and a low-temperature sensing node LH. The third resistor R23 is connected between the low-temperature sensing node LH and the diode D1. The diode D1 is connected between an end of the third transistor R23 and a ground.

Generally, a diode, for example, D1, operates in a forward bias region when its terminal is set on a positive voltage. An I-V characteristic of the diode in a forward bias region is given in the approximate equation as follows.

$$i = I_s(e^{v/nV_T} - 1) \quad \text{[Equation 1]}$$

In Equation 1, Is is a constant referred to as saturation current, which is operative under constant temperature, but is highly affected by the temperature. $V_T$ is a constant referred to as thermal voltage. The parameter n is 1 or 2 in accordance with a material and physical structure of the diode. The saturation current Is increases twice according to an elevation of temperature by 5° C. Namely, the diode D1 has temperature dependency by which its current increases upon the elevation of temperature.

Returning to FIG. 3, as noted in Equation 1, the current Id1 of the diode D1 increases upon the elevation of temperature. If the diode current Id1 increases, a voltage VH of the high-temperature sensing node NH or a voltage VL of the low-temperature sensing node NL rises up by a determined voltage.

The high-temperature detection signal generator 153 includes a comparator 154 and an inverter 155. The comparator 154 operates to compare the high-temperature sensing voltage VH with the reference voltage Vref. The comparator 154 provides a low-level output signal to the inverter 155 when the high-temperature sensing voltage VH is higher than the reference voltage Vref. The inverter 155 operates to logically invert the output signal of the comparator 154 and then applies the high-temperature detection signal HTEMP to the high-temperature trimming circuit T14 of the regulator 140 shown in FIG. 2.

The log-temperature detection signal generator 156 is comprised of a comparator 157 and an inverter 158. The comparator 157 operates to compare the low-temperature sensing voltage VL with the reference voltage Vref. The comparator 157 provides a low-level output signal to the inverter 155 when the low-temperature sensing voltage VL is lower than the reference voltage Vref. The inverter 158 operates to logically invert the output signal of the comparator 154 and then applies the low-temperature detection signal LTEMP to the low-temperature trimming circuit T12 of the regulator 140 shown in FIG. 2.

In the exemplary embodiment, the temperature detector 150 generates the high-temperature detection signal HTEMP when the current temperature is higher than a reference, while it generates the low-temperature detection signal LTEMP when current temperature is lower than the reference. In FIG. 3, the high and low-temperature detection signal generators, 153 and 156, are coupled to a single temperature sensor 151, but the high or low-temperature detection signal generator, 153 or 156, may be coupled independently to the temperature sensor 151.

Returning to FIG. 1, the semiconductor memory device 100 according to an exemplary embodiment of the present invention includes the temperature detection 150 generating the temperature detection signals HTEMP and LTEMP. The semiconductor memory device 100 adjusts the output voltage VPP of the high voltage generator 120 by way of controlling the temperature trimming circuits T12 and T14 of the regulator 140 in compliance with the temperature detection circuit 150. Thereby, it is able to cure the troubles that the output voltage VPP becomes lower in higher temperature while becoming higher in lower temperature. According to the semiconductor memory device 100 of the exemplary embodiment of the present invention it is possible to prevent variation of the programming or erasing operations.

Figure 4:
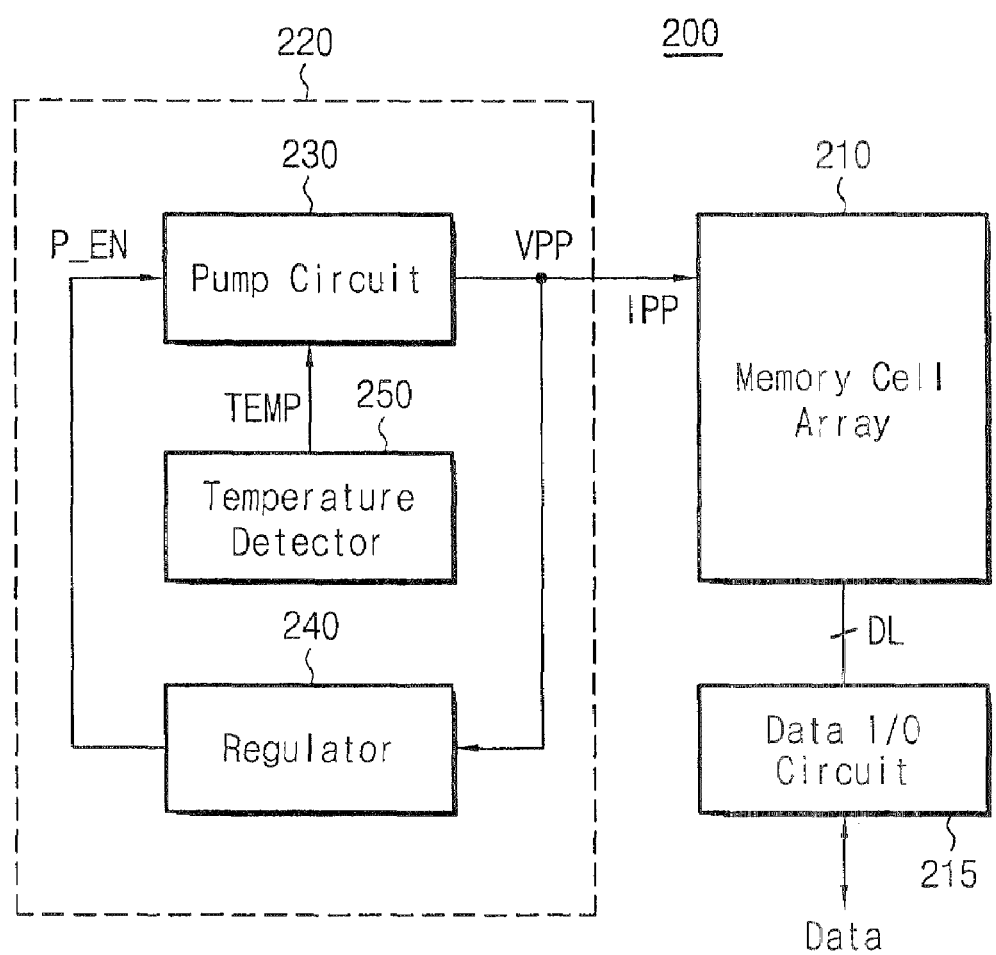
FIG. 4 is a block diagram illustrating a semiconductor memory device in accordance with an exemplary embodiment of the present invention.

FIG. 4 is a block diagram illustrating a semiconductor memory device in accordance with an exemplary embodiment of the present invention. Referring to FIG. 4, the semiconductor memory device 200 is comprised of a memory cell array 210, a data input/output circuit 215, and a high voltage generator 220. The semiconductor memory device 200 controls a level of an output current IPP of the high voltage generator 220. The features of the memory cell array 200 and the data input/output circuit 215 are the same as those described in conjunction with FIG. 1.

Referring to FIG. 4, the high voltage generator 220 is comprised of a pump circuit 230, a regulator 240, and a temperature detector 250. The semiconductor memory device 200 of this exemplary embodiment controls a level of the output current IPP of the high voltage generator 220 in accordance with a state of a temperature detection signal TEMP.

The pump circuit 230 provides the memory cell array 210 with the high voltage VPP that is higher than the power source voltage VCC. With the high voltage VPP supplied from the pump circuit 230, the memory cell array 210 conducts a programming or erasing operation. The pump circuit 230 operates in response to the pumping enable signal P_EN, boosting the power source voltage VCC (not shown) up to the high voltage VPP. The pump circuit also adjusts a level of the output current IPP in response to the temperature detection signal TEMP provided from the temperature detector 250. The structural and operational features of the pump circuit 230 will be described in detail with reference to FIG. 5.

Figure 5:
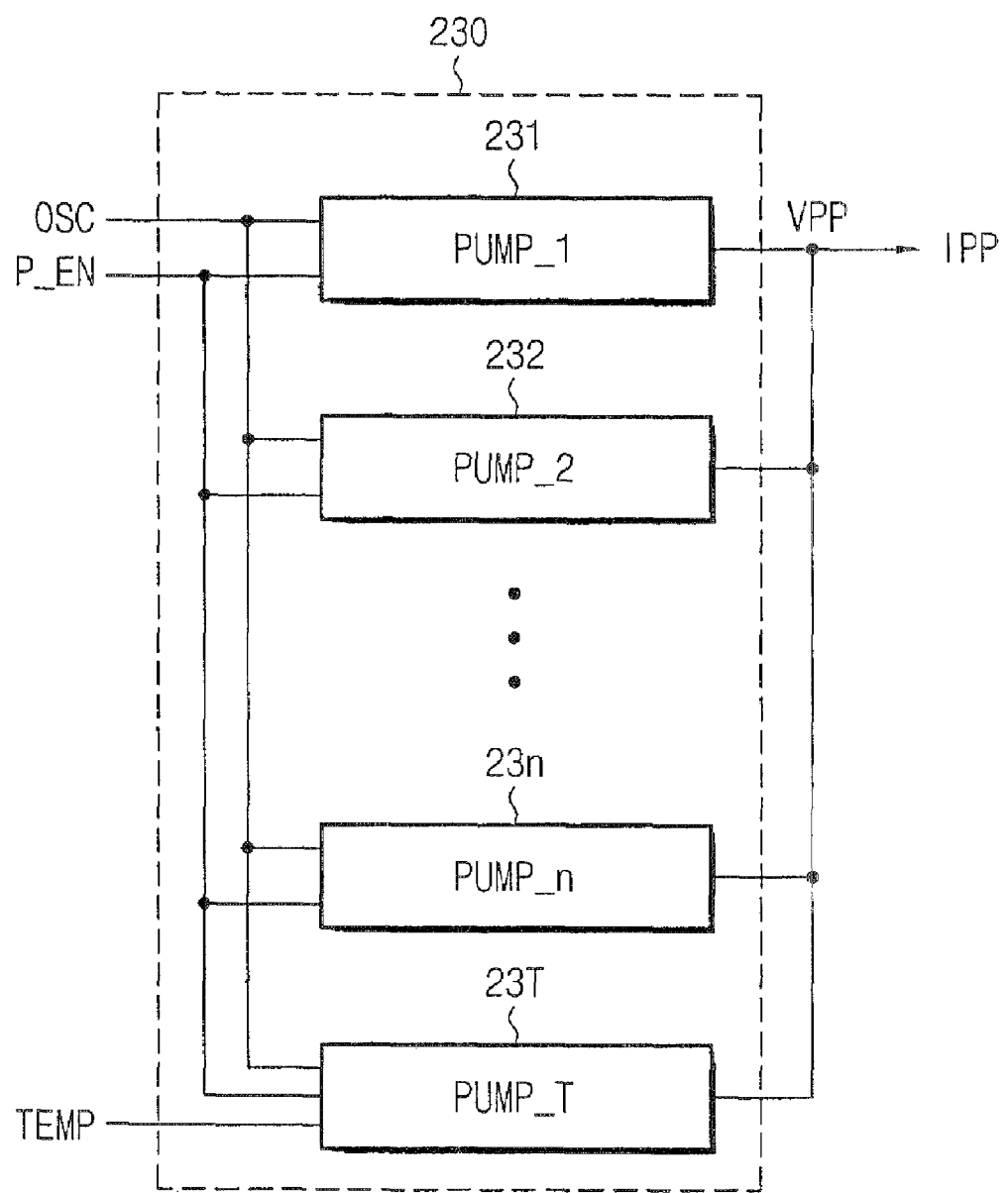
FIG. 5 is a circuit diagram exemplarily illustrating the pump circuit shown in FIG. 4.

FIG. 5 is a circuit diagram exemplarily illustrating the pump circuit 230 shown in FIG. 4. Referring to FIG. 5, the pump circuit 230 includes a plurality of normal pumps 231~23n and a temperature pump 23T. The normal pumps 231~23T are coupled to the temperature pump 23T and to each other in parallel. The pump circuit 230 responds to the pumping enable signal PP_EN, by conducting a pumping operation in response to an oscillation signal OSC. The pumping enable signal P_EN is provided from the regulator 240 of FIG. 4. The oscillation signal OSC is provided from an oscillator (not shown).

The normal pumps 231~23n generate the high voltage VPP by way of the pumping operation that is well known. The temperature pump 23T also responds to the temperature detection signal TEMP in addition to the pumping enable signal P_EN and the oscillation signal OSC. Namely, the pump circuit 230 conducts the pumping operation by means of the n normal pumps 231~23n during a normal mode. On the other hand, when there is an input of the temperature detection signal TEMP, the n normal pumps 231~23n conduct the pumping operation in conjunction with the temperature pump 23T. The temperature pump 23T is activated to increase a level of the output current IPP of the pump circuit 230. Thereby, the semiconductor memory device 200 shown in FIG. 4 is able to raise the level of the output current IPP of the pump circuit 230 in the face of a high temperature.

Returning to FIG. 4, the regulator 240 controls the pump circuit 230 to make the output voltage VPP of the pump circuit 230 have a constant level. The regulator 240 detects whether the output voltage VPP of the pump circuit 230 reaches a predetermined level, and the regulator 240 provides the pumping enable signal P_EN in accordance with a result of the detection. For instance, the regulator 240 generates the pumping enable signal P_EN when the output voltage VPP of the pump circuit 230 is lower than the predetermined level, for example, 9V.

The temperature detector 250 generates the temperature detection signal TEMP by means of the temperature dependency of a diode, as described above in conjunction with FIG. 1. The temperature detector 250 provides the temperature detection signal TEMP to the temperature pump 23T of the pump circuit 230. The structural and operational features of the temperature detector 250 will be described with reference to FIG. 6.

Figure 6:
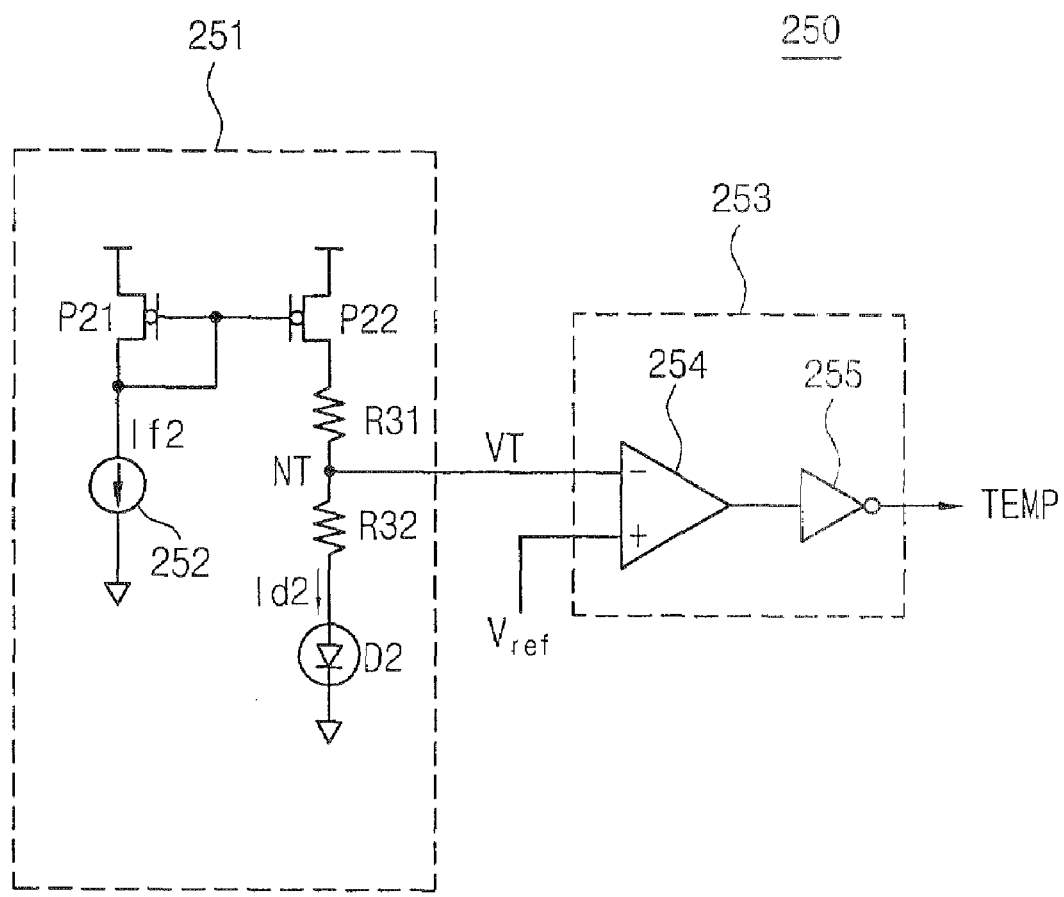
FIG. 6 is a circuit diagram exemplarily illustrating the temperature detector shown in FIG. 4.

FIG. 6 is a circuit diagram exemplarily illustrating the temperature detector 250 shown in FIG. 4. Referring to FIG. 6, the temperature detector 250 is comprised of a temperature sensor 251 and a temperature detection signal generator 253.

The temperature sensor 251 includes a current mirror circuit composed of a current source 252 and PMOS transistors P21 and P22, a plurality of resistors R31 and R32, and a diode D2. The temperature sensor 251 generates a temperature sensing voltage VT through the temperature sensing node NT. As described above in relation to Equation 1, a current Id2 of the diode D2 increases along with an elevation of temperature. If the diode current Id2 increases, the temperature sensing voltage VT becomes higher by reason of the voltage drop across the resistor.

The temperature detection signal generator 253 is comprised of a comparator 254 and an inverter 255. The comparator 254 operates to compare the temperature sensing voltage VT with the reference voltage Vref. The comparator 254 applies a low-level signal to the inverter 255 when the temperature sensing voltage VT is higher than the reference voltage Vref. The inverter 255 logically inverts an output signal of the comparator 254, and provides the temperature detection signal TEMP to the pump circuit 230 of FIG. 4.

Returning to FIG. 4, the semiconductor memory device 200 includes the temperature detector 250 for generating the temperature detection signal TEMP by means of the temperature dependency of the diode D2. The semiconductor memory device 200 adjusts the output current IPP of the pump circuit 230 by controlling the temperature pump 23T of the pump circuit 230 in accordance with the temperature detection signal TEMP of the temperature detector 250. The semiconductor memory device 200 is able to overcome the problem that in the face of a high temperature, the output voltage VPP becomes lower and the output current IPP is insufficient in level. By the semiconductor memory device according to an exemplary embodiment of the present invention, it is possible to repair the deficiencies that the characteristics of the program or the erasure operations are fluctuated along with a variation of temperature.

In summary, the output current and voltage of the high voltage generator is automatically adjustable in accordance with the temperature. Thus, it prevents fluctuations of the output voltage or current and deterioration of the program or the erasure characteristics of memory cells that is caused from the fluctuation of the output voltage or current.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory device comprising:
   a memory cell array;
   a high voltage generator providing a high voltage that exceeds a power source voltage to the memory cell array through an output terminal, generating a temperature detection signal by detecting a variation of a diode current in accordance with a variation of temperature, and adjusting a voltage level of the high voltage at the output terminal in response to the temperature detection signal from the diode.

2. The semiconductor memory device as set forth in claim 1, wherein the high voltage generator comprises:
   a pump circuit generating the high voltage by boosting the power source voltage;
   a regulator adjusting an output voltage of the pump circuit in response to the temperature detection signal; and
   a temperature detector generating the temperature detection signal by detecting the variation of the diode current in accordance with the variation of temperature.

3. The semiconductor memory device as set forth in claim 1, wherein the high voltage generator comprises:
   a pump circuit including a normal pump and a temperature pump;
   a regulator adjusting an output voltage of the pump circuit; and
   a temperature detector generating the temperature detection signal by sensing the variation of the diode current according to the variation of temperature,
   wherein the temperature pump adjusts an output current of the pump circuit in response to the temperature detection signal.

4. The semiconductor memory device as set forth in claim 1, wherein the high voltage is a voltage to be provided to the memory cell array for programming data therein.

5. The semiconductor memory device as set forth in claim 1, wherein the high voltage is a voltage to be provided to the memory cell array for erasing data therein.

6. A semiconductor memory device comprising:
   a memory cell array;
   a pump circuit providing the memory cell array with a high voltage obtained by boosting a power source voltage in response to a pumping enable signal;
   a regulator generating the pumping enable signal in accordance with an output voltage level of the pump circuit and adjusting the output voltage level of the pump circuit in response to a temperature detection signal; and
   a temperature detector including a diode and generating the temperature detection signal obtained by sensing a variation of the diode current according to a variation of temperature.

7. The semiconductor memory device as set forth in claim 6, wherein the regulator comprises a trimming circuit adjusting the output voltage level of the pump circuit in response to the temperature detection signal.

8. The semiconductor memory device as set forth in claim 7, wherein the trimming circuit is a transistor turned on or off in response to the temperature detection signal.

9. The semiconductor memory device as set forth in claim 7, wherein the trimming circuit comprises low-temperature and high-temperature trimming circuits,
   wherein the high-temperature trimming circuit raises the output voltage level of the pump circuit in response to a high-temperature detection signal and the low-temperature trimming circuit lowers the output voltage level of the pump circuit in response to a low-temperature detection signal.

10. The semiconductor memory device as set forth in claim 6, wherein the temperature detector comprises:
    a temperature sensor operating to sense the variation of the diode current in accordance with the variation of temperature and generating a temperature sensing voltage through a temperature sensing node; and
    a temperature detection signal generator comparing the temperature sensing voltage with a reference voltage and generating the temperature detection signal.

11. The semiconductor memory device as set forth in claim 10, wherein the regulator comprises a trimming circuit adjusting the output voltage level of the pump circuit in response to the temperature detection signal.

12. The semiconductor memory device as set forth in claim 11, wherein the temperature sensor generates a high-temperature sensing voltage through a high-temperature sensing node and generates a low-temperature sensing voltage through a low-temperature sensing node,
    wherein the temperature detection signal generator operates to generate a high-temperature detection signal obtained by comparing the high-temperature sensing voltage with the reference voltage and to generate a low-temperature detection signal obtained by comparing the low-temperature sensing voltage with the reference voltage.

13. The semiconductor memory device as set forth in claim 12, wherein the trimming circuit comprises high-temperature and low-temperature trimming circuits,
    wherein the high-voltage trimming circuit raises the output voltage level of the pump circuit in response to the high-temperature detection signal and the low-temperature trimming circuit lowers the output voltage level of the pump circuit in response to the low-temperature detection signal.

14. A semiconductor memory device comprising:
    a memory cell array;
    a pump circuit generating a high voltage obtained by boosting a power source voltage in response to a pumping enable signal, providing the high voltage to the memory cell array through an output terminal, and adjusting a voltage level of the output terminal in response to a temperature detection signal;
    a regulator connected to the output terminal of the pump circuit and generating the pumping enable signal in accordance with the voltage level of the output terminal; and a temperature detection circuit including a diode and generating the temperature detection signal obtained by sensing variation of the diode current according to a variation of temperature.

15. The semiconductor memory device as set forth in claim 14, wherein the pump circuit comprises normal and temperature pumps receiving the pumping enable signal, wherein the temperature pump adjusts a level of an output current of the pump circuit in response to the pumping enable signal and the temperature detection signal.

16. The semiconductor memory device as set forth in claim 15, wherein the temperature detection circuit comprises:

a temperature sensor to sense the variation of the diode current in accordance with the variation of temperature and generating a temperature sensing voltage through a temperature sensing node; and a temperature detection signal generator comparing the temperature sensing voltage with a reference voltage and generating the temperature detection signal.

17. The semiconductor memory device as set forth in claim 16, wherein the pump circuit raises a level of the output current in response to the temperature detection signal.

* * * * *